United States Patent
Huang et al.

(10) Patent No.: US 10,381,351 B2
(45) Date of Patent: Aug. 13, 2019

(54) TRANSISTOR STRUCTURE AND SEMICONDUCTOR LAYOUT STRUCTURE

(71) Applicant: NANYA TECHNOLOGY CORPORATION, New Taipei (TW)

(72) Inventors: Ching-Chia Huang, Taipei (TW); Tseng-Fu Lu, New Taipei (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/879,929

(22) Filed: Jan. 25, 2018

(65) Prior Publication Data
US 2019/0198502 A1    Jun. 27, 2019

Related U.S. Application Data

(60) Provisional application No. 62/610,330, filed on Dec. 26, 2017.

(51) Int. Cl.
| H01L 29/76 | (2006.01) |
| H01L 27/108 | (2006.01) |
| H01L 29/423 | (2006.01) |
| H01L 29/06 | (2006.01) |
| H01L 29/78 | (2006.01) |

(52) U.S. Cl.
CPC .... *H01L 27/10823* (2013.01); *H01L 29/0696* (2013.01); *H01L 29/4236* (2013.01); *H01L 29/4238* (2013.01); *H01L 29/42368* (2013.01); *H01L 29/7827* (2013.01); *H01L 29/7831* (2013.01)

(58) Field of Classification Search
CPC .................. H01L 29/0696; H01L 29/4236
See application file for complete search history.

(56) References Cited

U.S. PATENT DOCUMENTS

| 8,716,768 B2 | 5/2014 | Lyu et al. | |
| 2013/0037882 A1* | 2/2013 | Kim | H01L 29/4236 257/331 |

\* cited by examiner

*Primary Examiner* — Samuel A Gebremariam
(74) *Attorney, Agent, or Firm* — Muncy, Geissler, Olds & Lowe, P.C.

(57) ABSTRACT

The present disclosure provides a transistor structure and a semiconductor layout structure. The transistor structure includes an active region, a buried gate structure disposed in the active region, a plurality of first dielectric layers disposed over sidewalls of the buried gate structure, and a source/drain region disposed in the active region at two opposite sides of the buried gate structure. In some embodiments, the buried gate structure includes a first portion and a second portion perpendicular to the first portion. In some embodiments, the buried gate structure is separated from the source/drain region by the first dielectric layers as viewed in a top view.

20 Claims, 8 Drawing Sheets

TRANSISTOR STRUCTURE AND SEMICONDUCTOR LAYOUT STRUCTURE

PRIORITY DATA

This patent application claims the benefit of U.S. Provisional Patent Application Ser. No. 62/610,330 filed Dec. 26, 2017, the entire disclosure of which is hereby incorporated by reference.

TECHNICAL FIELD

The present disclosure relates to a transistor structure and a semiconductor layout structure, and more particularly, to a transistor structure including a non-planar channel region and a semiconductor layout structure for a memory device.

DISCUSSION OF THE BACKGROUND

Electrical products are becoming lighter, thinner, shorter, and smaller, and DRAMs are being scaled down to match the trends of high integration and high density. A DRAM including many memory cells is one of the most popular volatile memory devices utilized today. Each memory cell includes a transistor and at least a capacitor, wherein the transistor and the capacitor form a series connection with each other. The memory cells are arranged into memory arrays. The memory cells are addressed via a word line and a digit line (or bit line), one of which addresses a column of memory cells while the other addresses a row of memory cells. By using the word line and the digit line, a DRAM cell can be read and programmed.

Further, as semiconductor fabrication technology continues to improve, sizes of electronic devices are reduced, and the size of memory cells decreases correspondingly. Accordingly, gate control ability for such memory cells becomes a serious issue in a memory device.

This Discussion of the Background section is for background information only. The statements in this Discussion of the Background are not an admission that the subject matter disclosed in this section constitutes a prior art to the present disclosure, and no part of this to section may be used as an admission that any part of this application, including this Discussion of the Background section, constitutes prior art to the present disclosure.

SUMMARY

One aspect of the present disclosure provides a transistor structure. The transistor structure includes an active region, a buried gate structure disposed in the active region, a plurality of first dielectric layers disposed over sidewalls of the buried gate structure, and a source/drain region disposed in the active region at two opposite sides of the buried gate structure. In some embodiments, the buried gate structure includes a first portion and a second portion perpendicular to the first portion. In some embodiments, the buried gate structure is separated from the source/drain region by the first dielectric layers as viewed in a top view.

In some embodiments, the first portion includes a first width, the second portion includes a second width, and the first width is greater than the second width.

In some embodiments, the first width of the first portion is between a half word-line pitch and a word-line pitch.

In some embodiments, the first portion and the second portion form a right angle.

In some embodiments, the transistor structure further includes a second dielectric layer disposed under the buried gate structure. In some embodiments, the buried gate structure is separated from the active region by the second dielectric layer as seen in a cross-sectional view.

In some embodiments, a thickness of the first dielectric layers to and a thickness of the second dielectric layer are equal to each other.

In some embodiments, the transistor structure further includes a channel region formed in an L shape as viewed from in a top view and in a U shape as seen in a cross-sectional view.

In some embodiments, the buried gate structure further is includes a third portion perpendicular to the second portion. In some embodiments, the first dielectric layers are disposed over sidewalls of the third portion to separate the third portion of the buried gate structure from the source/drain region as viewed in the top view.

In some embodiments, the transistor structure further includes a second dielectric layer disposed under the buried gate structure. In some embodiments, the buried gate structure is separated from the active region by the second dielectric layer as seen in a cross-sectional view.

In some embodiments, the transistor structure further includes a channel region formed in a C shape as viewed in the top view and in a U shape as seen in a cross-sectional view.

In some embodiments, the first portion and the third portion are disposed at two opposite ends of the second portion. In some embodiments, the first portion and the third portion are physically in contact with the second portion.

In some embodiments, the first portion and the third portion include a first width, and the second portion includes a second width. In some embodiments, the first width is greater than the second width.

In some embodiments, the first width is between a half word-line pitch and a word-line pitch.

In some embodiments, the first portion and the second portion form a right angle, and the third portion and the second portion form a right angle.

In some embodiments, the transistor structure further includes a plurality of isolation structures disposed over the active region. In is some embodiments, portions of the source/drain region are exposed through the isolation structures.

Another aspect of the present disclosure provides a semiconductor layout structure. The semiconductor layout structure includes a plurality of active regions surrounded by a plurality of isolation structures, at least one first buried gate structure disposed over the active regions and the isolation structures, at least one second buried gate structure disposed over the active regions and the isolation structures, a plurality of source regions disposed in the active regions, and a plurality of drain regions disposed in the active regions. In some embodiments, the first buried gate structure includes a plurality of first portions extending in a first direction and a plurality of third portions extending in a second direction different from the first direction. In some embodiments, the second buried gate structure includes a plurality of second portions parallel to the first portions in the first direction and a plurality of fourth portions parallel to the third portions in the second direction different from the first direction. In some embodiments, the source regions are disposed between the first buried gate structure and the second buried gate structure in the first direction. In some embodiments, the first buried gate structure and the second buried gate structure are disposed between the drain regions in the first direction.

In some embodiments, the first direction and the second direction form an included angle, and the included angle is greater than or less than 90°.

In some embodiments, the first portion of the first buried gate structure and the third portion of the first buried gate structure are alternately arranged. In some embodiments, the second portion of the second buried gate structure and the fourth portion of the second buried gate structure are alternately arranged.

In some embodiments, a first distance between two adjacent first portions and a second distance between two adjacent second portions are greater than a distance between two adjacent active regions. In some embodiments, a first distance between two adjacent first portions and a second distance between two adjacent second portions are greater than a width of the active regions.

In some embodiments, a first distance between two adjacent first portions and a second distance between two adjacent second portions are less than a distance between two adjacent active regions. In some embodiments, a first distance between two adjacent first portions and a second distance between two adjacent second portions are less than a width of the active regions.

In the present disclosure, a transistor structure including a U-shaped channel region as seen in a cross-sectional view and an L-shaped or C-shaped channel region as view in a top view is provided. Consequently, saturation current is increased and thus gate control ability is improved.

In contrast, with a comparative transistor structure or a semiconductor layout structure including a straight buried gate to structure, the device suffers from lower saturation current, and thus has inferior performance.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
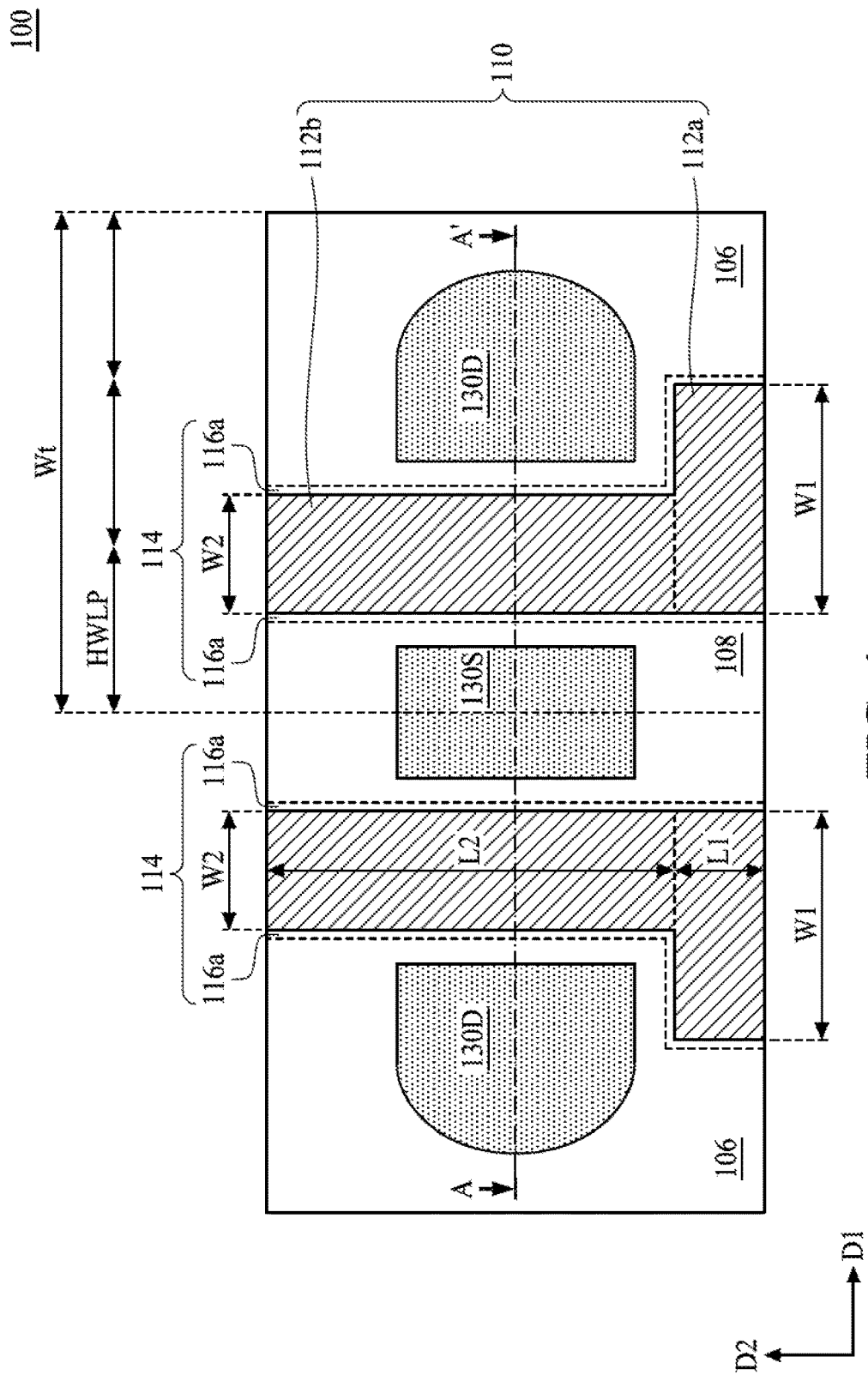
FIG. 1 is a schematic drawing illustrating a transistor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained to and integrated into the semiconductor device.

As used herein, the term "n-type doping/doped" is to represent adding electron-increasing dopants/impurities including, for example but not limited to, V or VI group atoms into a material matrix in order to manipulate the carrier numbers. As used herein, the term "p-type doping/doped" is to represent adding hole-increasing dopants/impurities including, for example but not limited to, II or III group atoms into a material matrix in order to manipulate the carrier numbers.

Figure 2:
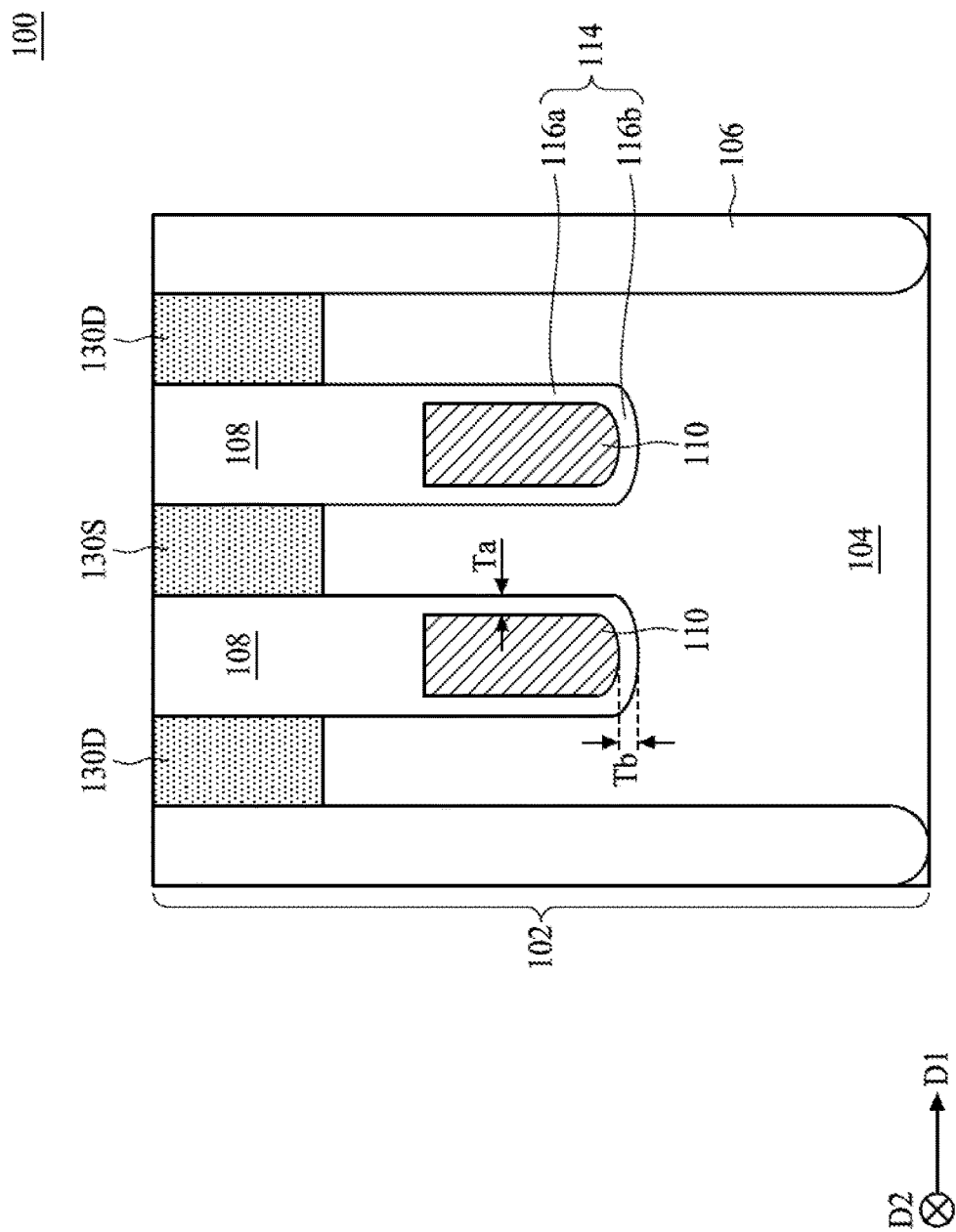
FIG. 2 is a cross-sectional view taken along line A-A' in FIG. 1.
Figure 3:
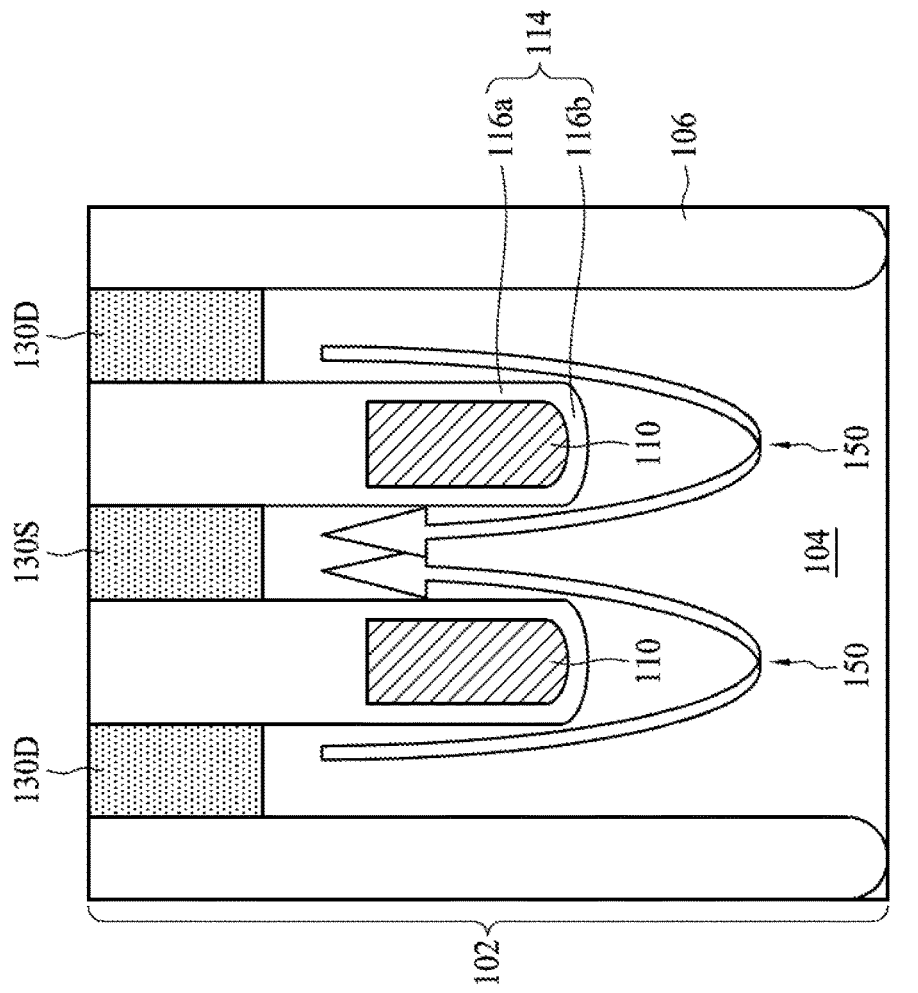
FIG. 3 is a cross-sectional view taken along line A-A' in FIG. 1 during operation.

FIG. 1 is a schematic drawing illustrating a transistor structure in accordance with some embodiments of the present disclosure, FIG. 2 is a cross-sectional view of the transistor structure taken along line A-A' of FIG. 1, and FIG. 3 is a cross-sectional view of the transistor structure taken along line A-A' of FIG. 1 during operation. In some embodiments, a transistor structure 100 is provided. The transistor structure 100 includes a substrate 102, shown in FIG. 2. The substrate 102 may include silicon (Si), silicon germanium (SiGe), gallium arsenide (GaAs), or other suitable semiconductor material. A well region (not shown) may be formed in the substrate 102. The well region may be neutral, or an n-type or p-type doped region, depending on the conductivity type of the transistor structure 100. An isolation structure 106, such as a shallow trench isolation (hereinafter abbreviated as STI) structure, is formed in the substrate 102 for defining at least an active region 104.

In some embodiments, the isolation structure 106 can be formed by the following steps. A pad oxide layer (not shown) is formed over the substrate 102. Next, a pad nitride layer (not shown) is formed. The pad oxide layer reduces stress on the substrate 102 from the pad nitride layer. Next, a patterned photoresist layer (not shown) defining a location of the isolation structure 106 is formed on the pad nitride layer. A portion of the pad nitride layer, a portion of the pad oxide layer and a portion of the substrate 102 exposed through the patterned photoresist layer are then removed, and a shallow trench (not shown) is formed in the substrate 102. After removal of the patterned photoresist layer, sidewalls and a bottom of the shallow trench are lined with an oxide liner (not shown) and the shallow trench is filled with an insulating material such as silicon oxide (SiO). For example, a high density plasma chemical vapor deposition oxide (HDP oxide) can be used to fill the shallow trench, but the disclosure is not limited thereto. Subsequently, a planarization process is performed to remove superfluous oxide with the pad nitride layer serving as a stop layer. Next, the well region can be formed in the substrate 102 and the pad nitride layer and the pad oxide layer can subsequently be removed. Consequently, the transistor structure 100 includes the isolation structure 106 surrounding the active region 104 as shown in FIGS. 1 and 2.

Referring to FIGS. 1 and 2, a buried gate structure 110 is next disposed in the substrate 102 and the active region 104. In some embodiments, at least one trench (not shown) is formed in the substrate 102 by proper etchants. Next, a dielectric layer 114 covering sidewalls and a bottom of the trench is conformally formed in the trench. In some embodiments, the dielectric layer 114 can include dielectric material having high dielectric constant (high-k). For example, the dielectric layer 114 can include SiO, silicon nitride (SiN), silicon oxynitride (SiON), metal oxide such as hafnium oxide (HfO), or other suitable material chosen for compatibility, but the disclosure is not limited thereto. A conductive layer is formed on the dielectric layer 114 and recessed such that a top surface of the conductive layer is lower than an opening of the trench. In some embodiments, the conductive layer can include polysilicon or other suitable material such as metal materials with proper work function, but the disclosure is not limited thereto. Next, an isolation structure 108 is formed to fill the trench, and a planarization process can be performed. Thus, a top surface of the active region 104 can be exposed, as shown in FIG. 2. Consequently, a buried gate structure 110, which serves as a buried word line for a DRAM device, is obtained. As shown in FIG. 2, a top surface of the buried gate structure 110 is lower than a surface of the substrate 102 or lower than a top surface of the isolation structure 108. However, it should be noted that the isolation structure 108 is omitted from FIG. 1 in order to clarify the size, the profile and the location of the buried gate structure 110. Next, a source/drain region 130S/130D is formed in the active region 104 at two opposite sides of the buried gate structure 110, as shown in FIGS. 1 and 2. The source/drain region 130S/130D includes an n-type or a p-type doped region, depending on the conductivity type of the transistor structure 100. In some embodiments, portions of the source/drain regions 130S/130D are exposed through the isolation structures 106 and 108, but the disclosure is not limited thereto.

Referring to FIGS. 1 and 2, the dielectric layer 114 can include a plurality of first dielectric layers 116a and a second dielectric layer 116b. In some embodiments, the first dielectric layers 116a are disposed over sidewalls of the buried gate structure 110, such that the sidewalls of the buried gate structure 110 are separated from and electrically isolated from the active region 104 by the first dielectric layers 116a as viewed in a top view, as shown in FIG. 1. In addition, the sidewalls of the buried gate structure 110 are separated from and electrically isolated from the active region 104 by the first dielectric layers 116a as seen in a cross-sectional view, as shown in FIG. 2. In some embodiments, the second dielectric layer 116b is disposed under a bottom of the buried gate structure 110, and thus the buried gate structure 110 is separated from and electrically isolated from the active region 104 by the second dielectric layer 116b as seen in the cross-sectional view, as shown in FIG. 2. In other words, the buried gate structure 110 is enclosed by the dielectric layer 114 and the isolation structure 108. Further, the buried gate structure 110 is separated from and electrically isolated from the source/drain region 130S/130D by the first dielectric layers 116a as viewed in the top view, as shown in FIG. 1. In some embodiments, a thickness Ta of the first dielectric layers 116a and a thickness Tb of the second dielectric layer 116b are equal to each other, but the disclosure is not limited to this.

Referring back to FIG. 1, the buried gate structure 110 includes a first portion 112a extending in a first direction D1 and a second portion 130b extending in a second direction D2. As shown in FIG. 1, the first direction D1 is perpendicular to the second direction D2. That is, the first portion 112a is perpendicular to the second portion 112b. In other words, the first portion 112a and the second portion 112b form a right angle. As shown in FIG. 1, the first portion 112a includes a first width W1, and the second portion 112b includes a second width W2. In some embodiments, the first width W1 is greater than the second width W2, as shown in FIG. 1. In some embodiments, the first width W1 of the first portion 112a is between a half word-line pitch (HWLP) and a word-line pitch (WLP), but the disclosure is not limited thereto. In some embodiments, a width Wt of one transistor structure 100 is three times the half-line pitch HWLP, as shown in FIG. 1, but the disclosure is not limited to this. The first portion 112a includes a first length L1, and the second portion 112b includes a second length L2. In some embodiments, the second length L2 is greater than the first length L1, as shown in FIG. 1.

Referring to FIGS. 1 and 3, during an operation, a channel region is formed around the buried gate structure 110, as depicted by an arrow 150 shown in FIG. 3. Because the buried gate structure 110 is embedded in the substrate 102, the channel region 150 is formed around the sidewalls and the bottom of the buried gate structure 110. As shown in FIG. 3, the channel region 150 may be formed in a U shape as seen in the cross-sectional view. Further, as shown in FIG. 1, the channel region may be formed in an L shape as viewed in the top view. Consequently, a non-planar channel region 150 is obtained.

Accordingly, the transistor structure 100 including the U-shaped channel region 150 as seen in the cross-sectional view and the L-shaped channel region 150 as viewed in the top view is provided. Consequently, saturation current is increased and thus gate control ability is improved.

Figure 4:
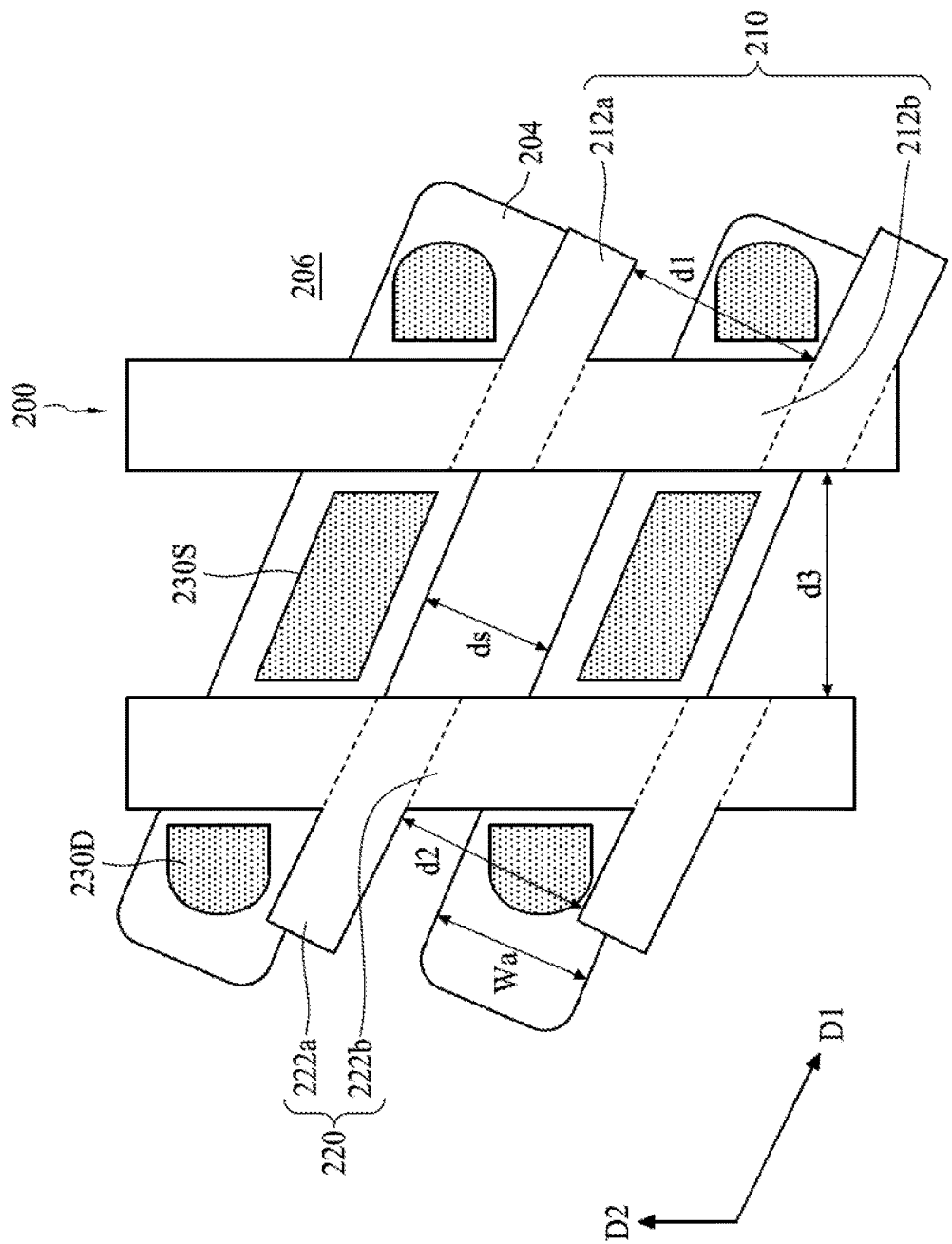
FIG. 4 is a schematic drawing illustrating a portion of a semiconductor layout structure in accordance with some embodiments of the present disclosure.

Referring to FIG. 4, which is a schematic drawing illustrating a portion of a semiconductor layout structure in accordance with some embodiments of the present disclosure, a semiconductor layout structure 200 is provided. In some embodiments, the semiconductor layout structure 200 includes a plurality of active regions 204 surrounded by a plurality of isolation structures 206. In some embodiments, the active regions 204 are separated and electrically isolated from each other by the isolation structures 206. In some embodiments, the semiconductor layout structure 200 includes at least one first buried gate structure 210 disposed over the active regions 204 and the isolation structures 206, and at least one second buried gate structure 220 disposed over the active regions 204 and the isolation structures 206.

In some embodiments, the first buried gate structure 210 includes a plurality of first portions 212a extending in a first direction D1 and a plurality of third portions 212b extending in a second direction D2. The first direction D1 and the second direction D2 are different from each other. In some embodiments, the first direction D1 and the second direction D2 form an included angle, and the included angle is greater than or less than 90°. The second buried gate structure 220 includes a plurality of second portions 222a extending in the first direction D1 and a plurality of fourth portions 222b extending in the second direction D2. In some embodiments, the second portions 222a of the second gate buried gate structure 220 are parallel to the first portions 212a of the first gate buried gate structure 210 in the first direction D1. In some embodiments, the fourth portions 222b of the second buried gate structure 220 are parallel to the third portions 212b of the first buried gate structure 210 in the second direction D2. As shown in FIG. 4, the first portions 212a and the third portions 212b of the first buried gate structure 210 are alternately arranged, and the second portions 222a and the fourth portions 222b of the second buried gate structure 220 are alternately arranged. A first distance d1 is between two adjacent first portions 212a. In some embodiments, the first direction d1 is greater than a distance ds between two adjacent active regions 204. In some embodiments, the first direction d1 is greater than a width Wa of the active regions 204. A second distance d2 is between two adjacent second portions 222a. In some embodiments, the second direction d2 is greater than the distance ds between two adjacent active regions 204. In some embodiments, the second direction d2 is greater than the width Wa of the active regions 204. A third distance d3 is between the third portions 212b of the first buried gate structure 210 and the fourth portions 222b of the second buried gate structure 220. In some embodiments, the third distance d3 is adjusted such that each of the first portions 212a overlaps a portion of each active region 204 and each of the second portions 222a overlaps a portion of each active region 204, as shown in FIG. 4.

The semiconductor layout structure 200 further includes a plurality of source regions 230S and a plurality of drain regions 230D disposed in the active regions 204. As shown in FIG. 4, the source regions 230S are disposed between the first buried gate structure 210 and the second buried gate structure 220 in the first direction D1. In some embodiments, the source regions 230S are disposed between the third portions 212b of the first buried gate structure 210 and the fourth portions 222b of the second buried gate structure 220 in the first direction D1. Therefore, the first buried gate structure 210 and the second buried gate structure 220 share the source region 230S therebetween. Further, the first buried gate structure 210 and the second buried gate structure 220 are disposed between the drain regions 230D in the first direction D1, as shown in FIG. 4. In some embodiments, the third portions 212b of the first buried gate structure 210 and the fourth portions 222b of the second buried gate structure 220 are disposed between the drain regions 230D in the first direction D1. Accordingly, the first portion 212a and the third portion 212b next to the drain region 230D substantially form an L shape, and the second to portion 222a and the fourth portion 222b next to the drain region 230D substantially form an L shape. Further, the first buried gate structure 210 and the second buried gate structure 220 are separated from and electrically isolated from the source regions 230S and the drain regions 230D by isolation structures 240.

Figure 5:
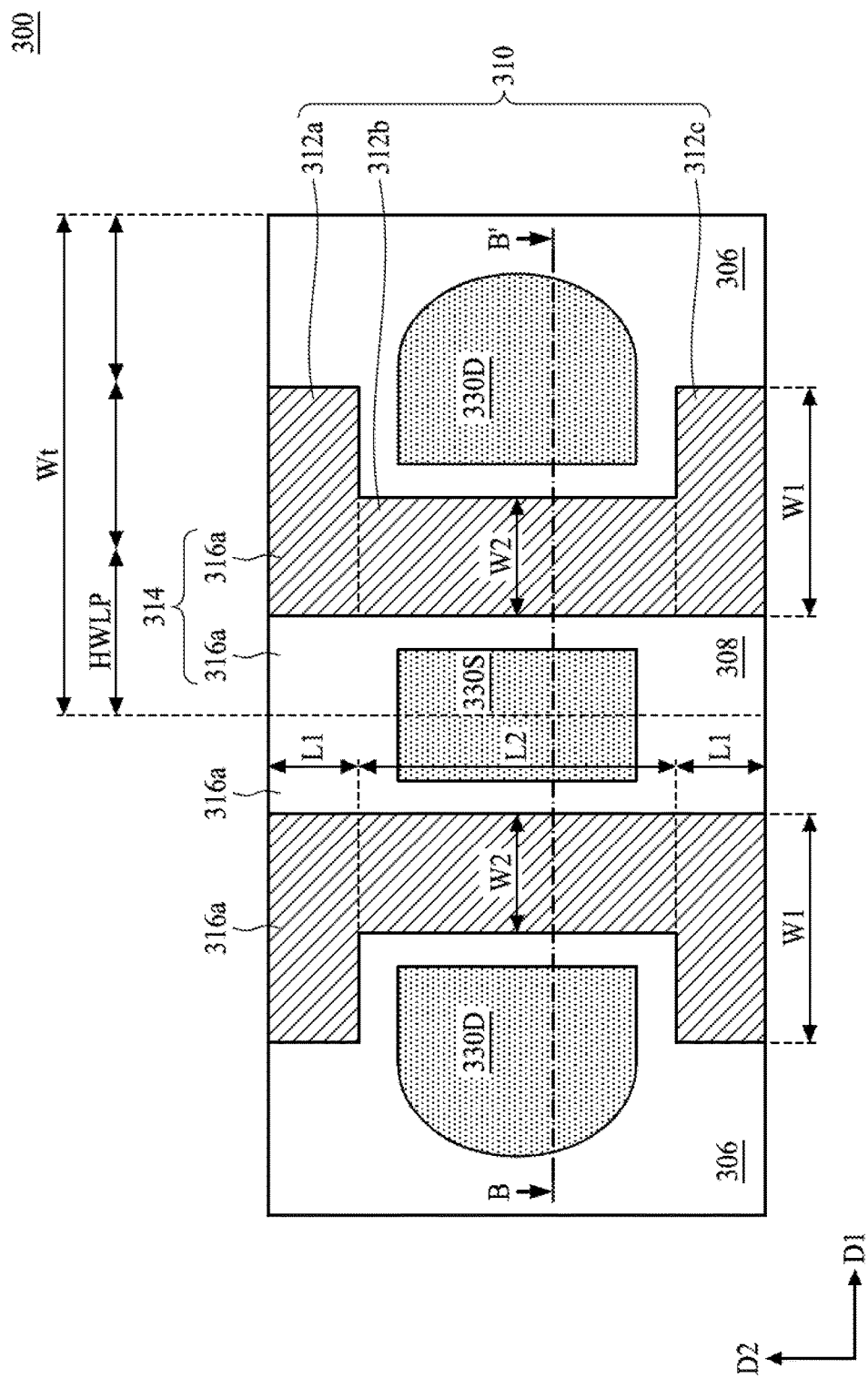
FIG. 5 is a schematic drawing illustrating a transistor structure in accordance with some embodiments of the present disclosure.
Figure 6:
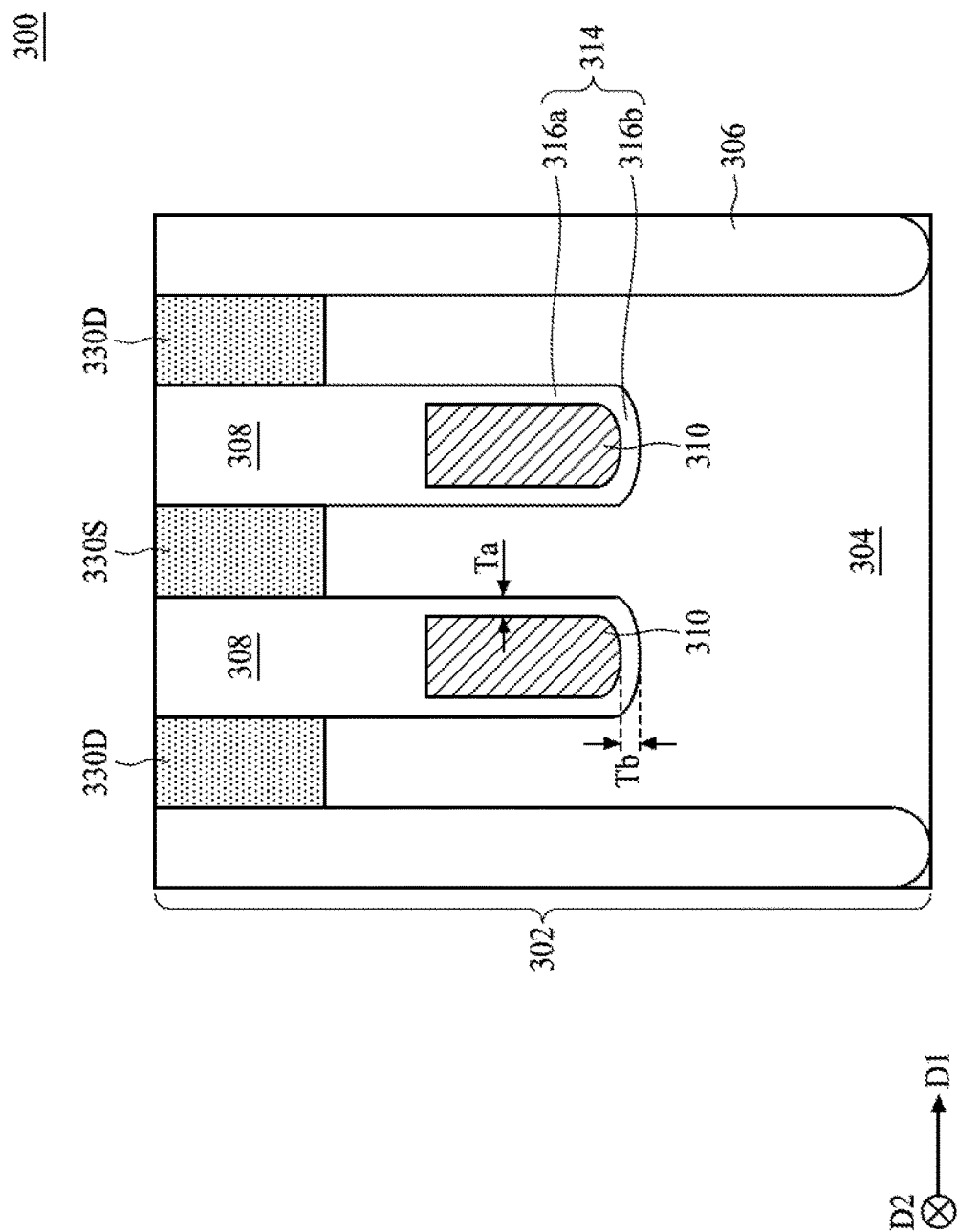
FIG. 6 is a cross-sectional view taken along line B-B' in FIG. 5.
Figure 7:
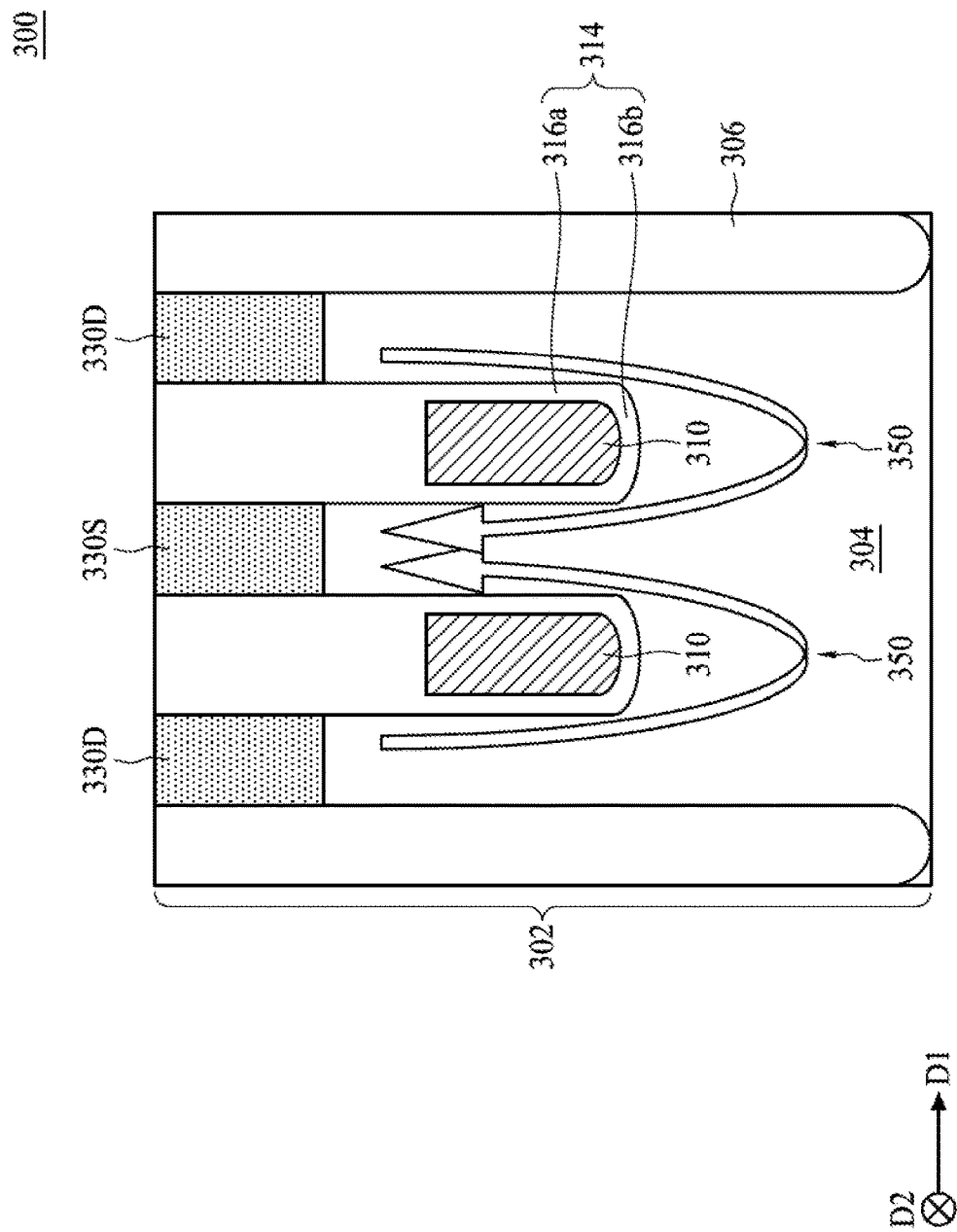
FIG. 7 is a cross-sectional view taken along line B-B' in FIG. 5 during operation.

FIG. 5 is a schematic drawing illustrating a transistor structure 300 in accordance with some embodiments of the present disclosure, FIG. 6 is a cross-sectional view of the transistor structure taken along line B-B' of FIG. 5, and FIG. 7 is a cross-sectional view of the transistor structure taken along line B-B' of FIG. 5 during operation. It should be noted that same elements in FIGS. 1 and 5 can be formed by same processes, and those elements can include same materials, thus details are omitted in the interest of brevity. In some embodiments, a transistor structure 300 is provided. The transistor structure 300 includes a substrate 302, as shown in FIG. 6. A well region (not shown) may be formed in the substrate 302, and an isolation structure 306 such as an STI structure is formed in the substrate 302 for defining at least an active region 304.

Referring to FIGS. 5 and 6, a buried gate structure 310 is disposed in the substrate 202 and the active region 204. As mentioned above, at least one trench (not shown) is formed in the substrate 302, and then a dielectric layer 314 covering sidewalls and a bottom of the trench is conformally formed in the trench. Next, a conductive layer is formed on the dielectric layer 314 and recessed such that a top surface of the conductive layer is lower than an opening of the trench. Subsequently, an isolation structure 308 is formed to fill the trench, and a planarization process can be performed. Thus a top surface of the active region 304 can be exposed, as shown in FIG. 6. Consequently, a to buried gate structure 310, which serves as a buried word line for a DRAM device, is obtained. As shown in FIG. 6, a top surface of the buried gate structure 310 is lower than a surface of the substrate 302 or lower than a top surface of the isolation structure 308. However, it should be noted that the isolation structure 308 is omitted from FIG. 5 in order to clarify the size, the profile and the location of the buried gate structure 310. Next, a source/drain region 330S/330D is formed in the active region 304 at two opposite sides of the buried gate structure 310, as shown in FIGS. 5 and 6. In some embodiments, portions of the source/drain regions 330S/330D are exposed through the isolation structures 306 and 308, but the disclosure is not limited thereto.

Still referring to FIGS. 5 and 6, the dielectric layer 314 can include a plurality of first dielectric layers 316a and a second dielectric layer 316b. In some embodiments, the first dielectric layers 316a are disposed over sidewalls of the buried gate structure 310, such that the sidewalls of the buried gate structure 310 are separated from and electrically isolated from the active region 304 by the first dielectric layers 316a as viewed in a top view, as shown in FIG. 5. Also, the sidewalls of the buried gate structure 310 are separated from and electrically isolated from the active region 304 by the first dielectric layers 316a as seen in a cross-sectional view, as shown in FIG. 6. In some embodiments, the second dielectric layer 316b is disposed under a bottom of the buried gate structure 310, and thus the buried gate structure 310 is separated from and electrically isolated from the active region 304 by the second dielectric layer 316b as seen in the cross-sectional view, as shown in FIG. 6. In other words, the buried gate structure 310 is enclosed by the dielectric layer 314 and the isolation structure 308. Further, the buried gate structure 310 is to separated from and electrically isolated from the source/drain region 330S/330D by the first dielectric layers 316a as viewed in the top view, as shown in FIG. 5. In some embodiments, a thickness Ta of the first dielectric layers 316a and a thickness Tb of the second dielectric layer 316b are equal to each other, but the disclosure is not limited to this.

Referring back to FIG. 5, the buried gate structure 310 includes a first portion 312a extending in a first direction D1, a second portion 312b extending in a second direction D2, and a third portion 312c extending in the first direction D1. As shown in FIG. 5, the first direction D1 is perpendicular to the second direction D2. That is, the 2o first portion 312a and the third portion 312c are perpendicular to the second portion 312b. The first portion 312a and the third portion 312c are disposed at two opposite ends of the second portion 312b. Further, the first portion 312a and the third portion 312c are both physically in contact with the second portion 312b, as shown in FIG. 5. Consequently, the first portion 312a and the second portion 312b form a right angle. Similarly, the third portion 312c and the second portion 312b form a right angle. As shown in FIG. 5, the first portion 312a and the third portion 312c include a first width W1, and the second portion 312b includes a second width W2. In some embodiments, the first width W1 is greater than the second width W2, as shown in FIG. 5. In some embodiments, the first width W of the first portion 312a is between a half word-line pitch (HWLP) and a word-line pitch (WLP), but the disclosure is not limited thereto. In some embodiments, a width Wt of one transistor structure 300 is three times the half-line pitch HWLP, as shown in FIG. 5, but the disclosure is not limited to this. The first portion 312a and third portion 312c include a first length L1, and the second portion 312b includes a second length L2. In some embodiments, the second length L2 is greater than the first length L1, as shown in FIG. 5.

Referring to FIGS. 5 and 7, during an operation, a channel region is formed around the buried gate structure 310, as depicted by an arrow 350 shown in FIG. 7. Because the buried gate structure 310 is embedded in the substrate 302, the channel region 350 is formed around the sidewalls and the bottom of the buried gate structure 310. As shown in FIG. 7, the channel region 350 may be formed in a U shape as seen in the cross-sectional view. Further, as shown in FIG. 5, the channel region 350 may be formed in a C shape as viewed in the top view. Consequently, a non-planar channel region 350 is obtained.

Accordingly, the transistor structure 300 including the U-shaped channel region 350 as seen in the cross-sectional view and the C-shaped channel region 350 as viewed in the top view is provided. Consequently, saturation current is increased and thus gate control ability is improved.

Figure 8:
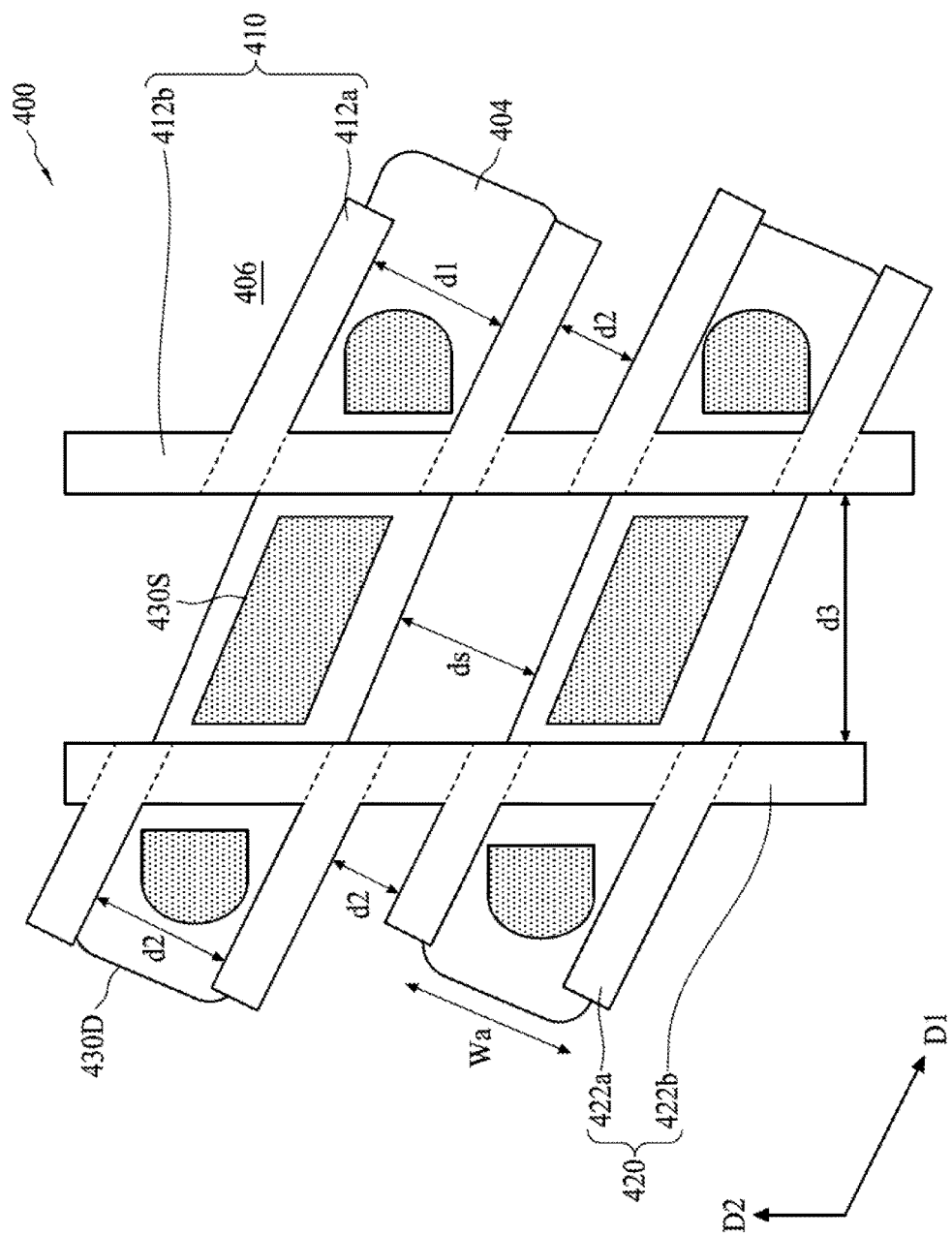
FIG. 8 is a schematic drawing illustrating a portion of a semiconductor layout structure in accordance with some embodiments of the present disclosure.

Referring to FIG. 8, which is a schematic drawing illustrating a portion of a semiconductor layout structure in accordance with some embodiments of the present disclosure, a semiconductor layout structure 400 is provided. In some embodiments, the semiconductor layout structure 400 includes a plurality of active regions 404 surrounded by a plurality of isolation structures 406. In some embodiments, the active regions 404 are separated and electrically isolated from each other by the isolation structures 406. In some embodiments, the semiconductor layout structure 400 includes at least one first buried gate structure 410 disposed over the active regions 404 and the isolation structures 406, and at least one second buried gate to structure 420 disposed over the active regions 404 and the isolation structures 406.

In some embodiments, the first buried gate structure 410 includes a plurality of first portions 412a extending in a first direction D1 and a plurality of third portions 412b extending in a second direction D2. The first direction D1 and the second direction D2 are different from each other. In some embodiments, the first direction D1 and the second direction D2 form an included angle, and the included angle is greater than or less than 90°. The second buried gate structure 420 includes a plurality of second portions 422a extending in the first direction D1 and a plurality of fourth portions 422b extending in the second direction D2. In some embodiments, the second portions 422a of the second gate buried gate structure 420 are parallel to the first portions 412a of the first gate buried structure 410 in the first direction D1. In some embodiments, the fourth portions 422b of the second buried gate structure 420 are parallel to the third portions 412b of the first buried gate structure 410 in the second direction D2. As shown in FIG. 8, the first portions 412a and the third portions 412b of the first buried gate structure 410 are alternately arranged, and the second portions 422a and the fourth portions 422b of the second buried gate structure 420 are alternately arranged. A first distance d1 is between two adjacent first portions 412a. In some embodiments, the first direction d1 is less than a distance ds between two adjacent active regions 404. In some embodiments, the first direction d1 is less than a width Wa of the active regions 404. A second distance d2 is between two adjacent second portions 422a. In some embodiments, the second direction d2 is less than the distance ds between two adjacent active regions 404. In some embodiments, the second direction d2 is less than the width Wa of the active regions 404. A third distance d3 is between the third portions 412b of the first buried gate structure 410 and the fourth portions 422b of the second buried gate structure 420. In some embodiments, the third distance d3 is adjusted such that each of the first portions 412a overlaps a portion of each active region 404 and each of the second portions 422a overlaps a portion of each active region 404, as shown in FIG. 8.

The semiconductor layout structure 400 further includes a plurality of source regions 430S and a plurality of drain regions 430D disposed in the active regions 404. As shown in FIG. 8, the source regions 430S are disposed between the first buried gate structure 410 and the second buried gate structure 420 in the first direction D1. In some embodiments, the source regions 430S are disposed between the third portions 412b of the first buried gate structure 410 and the fourth portions 422b of the second buried gate structure 420 in the first direction D1. Therefore, the first buried gate structure 410 and the second buried gate structure 420 share the source region 430S therebetween. Further, the first buried gate structure 410 and the second buried gate structure 420 are disposed between the drain regions 430D in the first direction D1, as shown in FIG. 8. In some embodiments, the third portions 412b of the first buried gate structure 410 and the fourth portions 422b of the second buried gate structure 420 are disposed between the drain regions 430D in the first direction D1. Further, the drain regions 430D are disposed in the active region 404 and between two adjacent first portions 412a, and disposed in the active regions 404 between two adjacent third portions 422a, as shown in FIG. 8. In other words, the drain region 430D is disposed next to two first portions 412a and one third portion 412b of the first buried gate structure 410. Similarly, the drain region 430D is disposed next to two second portions 422a and one fourth portion 422b of the second buried gate structure 420. Accordingly, the two first portions 412a and the one third portion 412b next to the drain region 430D substantially form a C shape, and the two second portions 422a and the one fourth portion 422b next to the drain region 430D substantially form a C shape. The first buried gate structure 410 and the second buried gate structure 420 are separated from and electrically isolated from the source regions 430S and the drain regions 430D by isolation structures 440.

In the present disclosure, a transistor structure 100 and 300 including a U-shaped channel region 150 and 350 as seen in a cross-sectional view is provided. Further, the transistor structure 100 includes an L-shaped channel region 150 as viewed in a top view while the transistor 300 includes the C-shaped channel region 350 as viewed in a top view. Consequently, saturation current is increased and thus gate control ability is improved.

In contrast, with a comparative transistor structure or a semiconductor layout structure including a straight buried gate structure, the device suffers from lower saturation current, and thus has inferior performance.

One aspect of the present disclosure provides a transistor structure. The transistor structure includes an active region, a buried gate structure disposed over the active region, a plurality of first dielectric layers disposed over sidewalls of the buried gate structure, and a source/drain region disposed in the active region at two opposite sides of the buried gate structure. In some embodiments, the buried gate structure includes a first portion extending in a first direction and a second portion extending in a second direction perpendicular to the first direction. In some embodiments, the buried gate structure is separated from the source/drain region by the first dielectric layers as viewed in a top view.

Another aspect of the present disclosure provides a semiconductor layout structure. The semiconductor layout structure includes a plurality of active regions surrounded by a plurality of isolation structures, at least one first buried gate structure disposed over the active regions and the isolation structures, at least one second buried gate structure disposed over the active regions and the isolation structures, a plurality of source regions disposed in the active regions, and a plurality of drain regions disposed in the active regions. In some embodiments, the first buried gate structure includes a plurality of first portions extending in a first direction and a plurality of third portions extending in a second direction different from the first direction. In some embodiments, the second buried gate structure includes a plurality of second portions parallel to the first portions in the first direction and a plurality of fourth portions parallel to the third portions in the second direction different from the first direction. In some embodiments, the source regions are disposed between the first buried gate structure and the second buried gate structure in the first direction. In some embodiments, the first buried gate structure and the second buried gate structure are disposed between the drain regions in the first direction. Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A transistor structure comprising:
   an active region;
   a buried gate structure disposed in the active region, the buried gate structure comprising:
   a first portion; and
   a second portion perpendicular to the first portion;
   a plurality of first dielectric layers disposed over sidewalls of the buried gate structure; and
   a source/drain region disposed in the active region at two opposite sides of the buried gate structure,
   wherein the buried gate structure is separated from the source/drain region by the first dielectric layers as viewed in a top view.

2. The transistor structure of claim 1, wherein the first portion comprises a first width, the second portion comprises a second width, and the first width is greater than the second width.

3. The transistor structure of claim 2, wherein the first width of the first portion is between a half word-line pitch and a word-line pitch.

4. The transistor structure of claim 1, wherein the first portion and the second portion form a right angle.

5. The transistor structure of claim 1, further comprising a second dielectric layer disposed under the buried gate structure, wherein the buried gate structure is separated from the active region by the second dielectric layer as seen in a cross-sectional view.

6. The transistor structure of claim 5, wherein a thickness of the first dielectric layers and a thickness of the second dielectric layer are equal to each other.

7. The transistor structure of claim 5, further comprising a channel region formed in an L shape as viewed in the top view and in a U shape as seen in the cross-sectional view.

8. The transistor structure of claim 1, wherein the buried gate structure further comprises a third portion perpendicular to the second portion, and the first dielectric layers are disposed over sidewalls of the third portion to separate the third portion of the buried gate structure from the source/drain region as viewed in the top view.

9. The transistor structure of claim 8, further comprising a second dielectric layer disposed under the buried gate structure, wherein the buried gate structure are separated from the active region by the second dielectric layer as seen in a cross-sectional view.

10. The transistor structure of claim 9, further comprising a channel region formed in a C shape as viewed in the top view and in a U shape as seen in the cross-sectional view.

11. The transistor structure of claim 8, wherein the first portion and the third portion are disposed at two opposite ends of the second portion, and are both physically in contact with the second portion.

12. The transistor structure of claim 8, wherein the first portion and the third portion comprise a first width, the second portion comprises a second width, and the first width is greater than the second width.

13. The transistor structure of claim 12, wherein the first width is between a half word-line pitch and a word-line pitch.

14. The transistor structure of claim 8, wherein the first portion and the second portion form a right angle, and the third portion and the second portion form a right angle.

15. The transistor structure of claim 1, further comprising a plurality of isolation structures disposed over the active region, wherein portions of the source/drain region are exposed through the isolation structures.

16. A semiconductor layout structure comprising:
a plurality of active regions surrounded by a plurality of isolation structures;
at least one first buried gate structure disposed over the active regions and the isolation structures, the first buried gate structure comprising a plurality of first portions extending in a first direction and a plurality of third portions extending in a second direction different from the first direction;
at least one second buried gate structure disposed over the active regions and the isolation structures, the second buried gate structure comprising a plurality of second portions parallel to the first portions in the first direction and a plurality of fourth portions parallel to the third portions in the second direction different from the first direction;
a plurality of source regions disposed in the active regions and between the first buried gate structure and the second buried gate structure in the first direction; and
a plurality of drain regions disposed in the active regions, wherein the first buried gate structure and the second buried gate structure are disposed between the drain regions in the first direction.

17. The semiconductor layout structure of claim 16, wherein the first direction and the second direction form an included angle, and the included angle is greater than or less than 90°.

18. The semiconductor layout structure of claim 16, wherein the first portions and the third portions of the first buried gate structure disposed over the active regions and the isolation structures are alternately arranged, and the second portions and the fourth portions of the second buried gate structure disposed over the active regions and the isolation structures are alternately arranged.

19. The semiconductor layout structure of claim 18, wherein a first distance between two adjacent first portions and a second distance between two adjacent second portions are greater than a distance between two adjacent active regions, or greater than a width of the active regions.

20. The semiconductor layout structure of claim 18, wherein a first distance between two adjacent first portions and a second distance between two adjacent second portions are less than a distance between two adjacent active regions, or less than a width of the active regions.

* * * * *